United States Patent
Seo et al.

(10) Patent No.: US 10,446,781 B2
(45) Date of Patent: Oct. 15, 2019

(54) QUANTUM DOT DEVICE AND ELECTRONIC DEVICE

(71) Applicant: SAMSUNG ELECTRONICS CO., LTD., Suwon-si, Gyeonggi-do (KR)

(72) Inventors: Hongkyu Seo, Anyang-si (KR); Eun Joo Jang, Suwon-si (KR); Dae Young Chung, Suwon-si (KR); Tae-Ho Kim, Suwon-si (KR); Sang Jin Lee, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/001,227

(22) Filed: Jun. 6, 2018

(65) Prior Publication Data
US 2019/0157595 A1    May 23, 2019

(30) Foreign Application Priority Data
Nov. 21, 2017 (KR) .................. 10-2017-0155647

(51) Int. Cl.
*H01L 29/08*        (2006.01)
*H01L 51/50*        (2006.01)
(Continued)

(52) U.S. Cl.
CPC ........ *H01L 51/502* (2013.01); *H01L 51/5004* (2013.01); *H01L 51/5056* (2013.01);
(Continued)

(58) Field of Classification Search
CPC ... H01L 51/52; H01L 51/502; H01L 51/5072; H01L 51/5056
See application file for complete search history.

(56) References Cited

U.S. PATENT DOCUMENTS

| 8,557,145 B2 | 10/2013 | Lee et al. |
| 9,281,488 B2 | 3/2016 | Lee et al. |

(Continued)

FOREIGN PATENT DOCUMENTS

| JP | 2007265637 A | 10/2007 |
| KR | 1020070014893 A | 2/2007 |

(Continued)

OTHER PUBLICATIONS

Extended European Search Report dated Apr. 29, 2019, of the corresponding European Patent Application No. 18195136.9.

*Primary Examiner* — Phuc T Dang
(74) *Attorney, Agent, or Firm* — Cantor Colburn LLP

(57) ABSTRACT

A quantum dot device includes an anode, a hole injection layer on the anode, a hole transport layer on the hole injection layer, a quantum dot layer on the hole transport layer, and a cathode on the quantum dot layer, wherein a highest occupied molecule orbital (HOMO) energy level of the quantum dot layer is greater than or equal to about 5.6 electronvolts (eV), a difference between a HOMO energy level of the hole transport layer and the highest occupied molecule orbital energy level of the quantum dot layer is less than about 0.5 eV, the hole injection layer has a first surface contacting the anode and a second surface contacting the hole transport layer, and a HOMO energy level of the first surface of the hole injection layer is different from a HOMO energy level of the second surface of the hole injection layer.

25 Claims, 3 Drawing Sheets

(51) Int. Cl.
*H01L 51/52* (2006.01)
*B82Y 20/00* (2011.01)
*B82Y 30/00* (2011.01)

(52) U.S. Cl.
CPC ...... *H01L 51/5072* (2013.01); *H01L 51/5088* (2013.01); *H01L 51/5206* (2013.01); *H01L 51/5221* (2013.01); *B82Y 20/00* (2013.01); *B82Y 30/00* (2013.01); *H01L 2251/5346* (2013.01); *H01L 2251/552* (2013.01)

(56) References Cited

U.S. PATENT DOCUMENTS

| | | |
|---|---|---|
| 9,583,725 B2 | 2/2017 | Lee |
| 2007/0024188 A1 | 2/2007 | Kim et al. |
| 2007/0187675 A1 | 8/2007 | Lee et al. |
| 2008/0020208 A1 | 1/2008 | Lee et al. |
| 2008/0231178 A1* | 9/2008 | Park .................. H01L 51/5088 313/504 |
| 2012/0068154 A1* | 3/2012 | Hwang ................ H01L 51/502 257/13 |
| 2012/0298971 A1 | 11/2012 | Lee et al. |
| 2012/0298974 A1 | 11/2012 | Lee et al. |
| 2014/0312339 A1* | 10/2014 | Fujita .................. H01L 27/322 257/40 |
| 2015/0280164 A1* | 10/2015 | Lin ..................... H01L 51/5056 257/40 |
| 2016/0020420 A1 | 1/2016 | Lee et al. |
| 2016/0225947 A1 | 8/2016 | Murayama et al. |
| 2016/0240730 A1* | 8/2016 | Murayama ............ H01L 51/502 |
| 2016/0336525 A1* | 11/2016 | Wu ........................ H01L 51/50 |
| 2017/0110608 A1* | 4/2017 | Yang .................. H01L 27/1461 |
| 2017/0271552 A1 | 9/2017 | Kim |

FOREIGN PATENT DOCUMENTS

| | | |
|---|---|---|
| KR | 1020070081623 A | 8/2007 |
| KR | 101041548 B1 | 6/2011 |
| KR | 1020120132655 A | 12/2012 |
| KR | 101386215 B1 | 4/2014 |
| KR | 101523135 B1 | 5/2015 |
| KR | 101546622 B1 | 8/2015 |
| KR | 1020160064320 A | 6/2016 |

* cited by examiner

QUANTUM DOT DEVICE AND ELECTRONIC DEVICE

CROSS-REFERENCE TO RELATED APPLICATION

This application claims priority to Korean Patent Application No. 10-2017-0155647 filed in the Korean Intellectual Property Office on Nov. 21, 2017, and all the benefits accruing therefrom under 35 U.S.C. § 119, the entire contents of which are incorporated herein by reference.

BACKGROUND

1. Field

A quantum dot device and an electronic device are disclosed.

2. Description of the Related Art

Unlike bulk materials, intrinsic physical characteristics (e.g., energy bandgaps, melting points, etc.) of nanoparticles may be controlled by changing the nanoparticle sizes. For example, semiconductor nanocrystal particles (also known as quantum dots) may be supplied with photoenergy or electrical energy and may emit light in a wavelength corresponding to sizes of the quantum dots. Accordingly, the quantum dots may be used as a light emitting element emitting light of a particular wavelength.

SUMMARY

Quantum dots can be used as a light emitting element a device, and have been the subject of recent research. However, quantum dots are different from a conventional light emitting element, and thus a new method of improving performance of a quantum dot device is required.

An embodiment provides a quantum dot device capable of realizing improved performance.

Another embodiment provides an electronic device including the quantum dot device.

According to an embodiment, a quantum dot device includes an anode, a hole injection layer disposed on the anode, a hole transport layer disposed on the hole injection layer, a quantum dot layer disposed on the hole transport layer, and a cathode disposed on the quantum dot layer, wherein a highest occupied molecule orbital (HOMO) energy level of the quantum dot layer is greater than or equal to about 5.6 electronvolts (eV), a difference between a HOMO energy level of the hole transport layer and a highest occupied molecule orbital energy level of the quantum dot layer is less than about 0.5 eV, the hole injection layer has a first surface contacting the anode and a second surface contacting the hole transport layer, and a HOMO energy level of the first surface of the hole injection layer is different from a HOMO energy level of the second surface of the hole injection layer.

The HOMO energy level of the second surface of the hole injection layer may be greater than the HOMO energy level of the first surface of the hole injection layer.

A difference between the HOMO energy level of the second surface of the hole injection layer and the HOMO energy level of the hole transport layer may be less than about 0.5 eV.

The HOMO energy level of the hole transport layer may be greater than or equal to about 5.4 eV.

The HOMO energy level of the hole transport layer may be about 5.6 eV to about 7 eV.

The HOMO energy level of the first surface of the hole injection layer may be about 5.0 eV to about 5.5 eV and the HOMO energy level of the second surface of the hole injection layer may be greater than about 5.5 eV and less than or equal to about 7 eV.

The hole injection layer may include a first compound and a second compound, and the second compound may have a higher HOMO energy level than the first compound and a surface energy less than a surface energy of the first compound.

The first compound may include a conductive polymer and the second compound may include an insulating polymer.

A weight ratio of the second compound to the first compound at the second surface of the hole injection layer may be greater than a weight ratio of the second compound to the first compound at the first surface of the hole injection layer.

A weight ratio of the second compound to the first compound may be gradually increased from the first surface of the hole injection layer to the second surface of the hole injection layer.

The second compound may be present in a greater amount than the first compound.

A weight ratio of the first compound to the second compound may be about 1:1.1 to about 1:10.

The first compound may include polythiophene, polyaniline, polypyrrole, poly(para-phenylene), polyfluorene, poly(3,4-ethylenedioxythiophene), a derivative thereof, or a combination thereof.

The second compound may include a fluorine-containing polymer.

The HOMO energy level of the quantum dot layer may be about 5.6 eV to about 7 eV.

The quantum dot layer may include a cadmium-free quantum dot.

The quantum dot layer may include a quantum dot having a core-shell structure.

The quantum dot may include a core including zinc (Zn), tellurium (Te), and selenium (Se) and a shell on at least one part of the core, and the shell may have a different composition from that of the core.

The shell may include ZnSeS, ZnS, or a combination thereof.

According to another embodiment, a quantum dot device includes an anode and a cathode facing each other, a quantum dot layer disposed between the anode and the cathode, and a hole injection layer disposed between the anode and the quantum dot layer, wherein the hole injection layer has a first surface contacting the anode and a second surface facing the first surface, the hole injection layer includes a first compound and a second compound having a higher HOMO energy level than the first compound and a surface energy less than a surface energy of the first compound, the second compound is present in a greater amount than the first compound, and a weight ratio of the second compound to the first compound at the first surface of the hole injection layer is different from a weight ratio of the second compound to the first compound at the first surface of the hole injection layer.

The first compound may include a conductive polymer and the second compound may include an insulating polymer.

The weight ratio of the second compound to the first compound at the second surface of the hole injection layer may be greater than the weight ratio of the second compound to the first compound at the first surface of the hole injection layer.

A weight ratio of the first compound to the second compound may be about 1:1.1 to about 1:10.

The quantum dot device may further including a hole transport layer between the hole injection layer and the quantum dot layer, and the HOMO energy level of the hole transport layer may be greater than or equal to about 5.4 eV.

The HOMO energy level of the hole transport layer may be about 5.6 eV to about 7 eV.

According to another embodiment, an electronic device including the quantum dot device is provided.

Performance of the quantum dot device may be improved.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
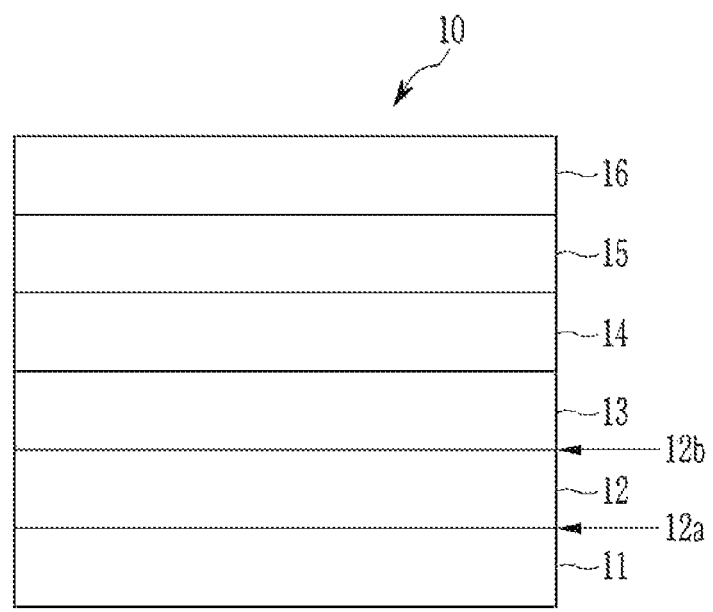
FIG. 1 is a schematic cross-sectional view of a quantum dot device according to an embodiment.

Hereinafter, example embodiments of the present disclosure will be described in detail so that a person skilled in the art would understand the same. This disclosure may, however, be embodied in many different forms and is not construed as limited to the example embodiments set forth herein. In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function, a HOMO energy level, or a lowest unoccupied molecular orbital (LUMO) energy level is expressed as an absolute value from a vacuum level. In addition, when the work function, HOMO energy level, or a LUMO energy level is said to be 'deep', 'large', or 'high,' the work function, HOMO energy level, or LUMO energy level has a large absolute value from '0 eV' of the vacuum level, while when the work function, HOMO energy level, or LUMO energy level is 'shallow', 'small', or 'low,' the work function, HOMO energy level, or LUMO energy level has a small absolute value from '0 eV' of the vacuum level.

Hereinafter, a quantum dot device according to an embodiment is described with reference to drawings.

Figure 2:
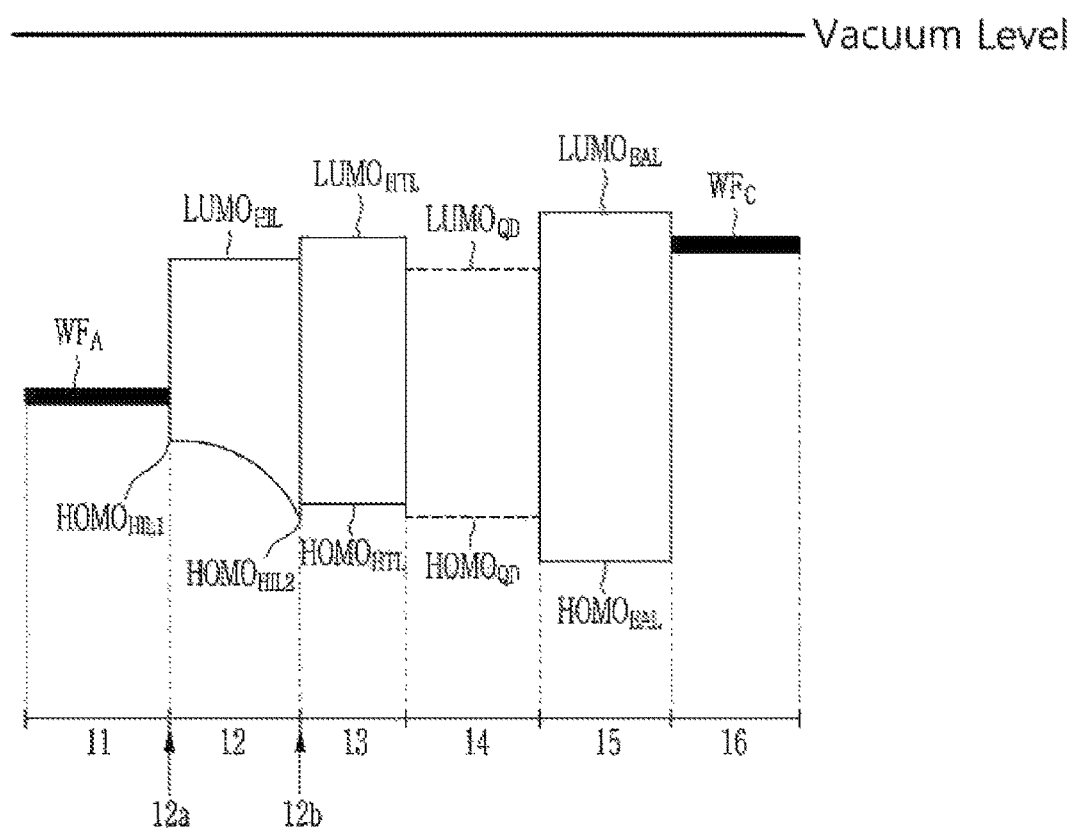
FIG. 2 is a schematic diagram showing an energy level of the quantum dot device of FIG. 1.

FIG. 1 is a schematic cross-sectional view of a quantum dot device according to an embodiment and FIG. 2 is a schematic diagram showing an energy level of the quantum dot device of FIG. 1.

Referring to FIG. 1, a quantum dot device 10 according to an embodiment includes an anode 11 and a cathode 16 facing each other, a quantum dot layer 14 disposed between the anode 11 and the cathode 16, a hole injection layer 12 and a hole transport layer 13 disposed between the anode 11 and the quantum dot layer 14, and an electron auxiliary layer (EAL) 15 disposed between the cathode 16 and the quantum dot layer 14.

A substrate (not shown) may be disposed on a surface of the anode 11 or a surface of the cathode 16.

The substrate may be for example made of an inorganic material such as glass; an organic material such as polycarbonate, polymethyl methacrylate, polyethylene terephthalate, polyethylene naphthalate, polyamide, polyethersulfone, or a combination thereof; or a silicon wafer.

The anode 11 may be made of a conductor having a relatively large work function to help hole injection, and may be for example a metal, a conductive metal oxide, or a combination thereof.

The anode 11 may be, for example made of a metal or an alloy thereof such as nickel, platinum, vanadium, chromium, copper, zinc, or gold; a conductive metal oxide such as zinc oxide, indium oxide, tin oxide, indium tin oxide (ITO), indium zinc oxide (IZO), or a fluorine-doped tin oxide; or a combination of metal and oxide such as ZnO and Al or $SnO_2$ and Sb, but is not limited thereto.

The cathode 16 may be for example made of a conductor having relatively low work function conductor to help electron injection and may be for example made of a metal, a conductive metal oxide, and/or a conductive polymer.

The cathode 16 may be for example a metal or an alloy thereof such as magnesium, calcium, sodium, potassium, titanium, indium, yttrium, lithium, gadolinium, aluminum silver, tin, lead, cesium, or barium; a multi-layer structure material such as LiF/Al, $LiO_2$/Al, LiF/Ca, Liq/Al, and $BaF_2$/Ca, but is not limited thereto.

At least one of the anode 11 and the cathode 16 may be a light-transmitting electrode and the light-transmitting electrode may be for example made of a conductive oxide such as a zinc oxide, indium oxide, tin oxide, indium tin oxide (ITO), indium zinc oxide (IZO), or fluorine doped tin oxide, or a metal thin layer of a single layer or a multilayer.

When one of the anode 11 and the cathode 16 is a non-light-transmitting electrode, it may be made of for example an opaque conductor such as aluminum (Al), silver (Ag), or gold (Au).

The quantum dot layer 14 includes a quantum dot.

The quantum dot may be a semiconductor nanocrystal, and may have various shapes, for example an isotropic semiconductor nanocrystal, a quantum rod, or a quantum plate.

Herein, the quantum rod may be a quantum dot having an aspect ratio (length:width ratio) of greater than about 1, for example an aspect ratio of greater than or equal to about 2, greater than or equal to about 3, or greater than or equal to about 5.

For example, the quantum rod may have an aspect ratio of less than or equal to about 50, of less than or equal to about 30, or of less than or equal to about 20.

The quantum dot may have for example a particle diameter (an average largest particle diameter for a non-spherical shape) of for example about 1 nanometer (nm) to about 100 nm, about 1 nm to about 80 nm, about 1 nm to about 50 nm, or about 1 nm to 20 nm.

Energy bandgaps of quantum dots may be controlled according to sizes and compositions of the quantum dots, and thus light emitting wavelength may be controlled.

For example, as the sizes of quantum dots increase, the quantum dots may have narrower energy bandgaps and thus emit light in a relatively long wavelength region while as the sizes of the quantum dots decrease, the quantum dots may have wider energy bandgaps and thus emit light in a relatively short wavelength region.

For example, the quantum dot may emit for example light in a predetermined wavelength region of a visible ray region according to its size and/or composition.

For example, the quantum dot may emit blue light, red light, or green light, and the blue light may have for example a peak emission wavelength at about 430 nm to about 470 nm, the red light may have for example a peak emission wavelength at about 620 nm to about 660 nm, and the green light may have for example a peak emission wavelength at about 510 nm to about 550 nm.

The quantum dot may have for example a quantum yield of greater than or equal to about 10%, greater than or equal to about 30%, greater than or equal to about 50%, greater than or equal to about 60%, greater than or equal to about 70%, or greater than or equal to about 90%.

The quantum dot may have a relatively narrow full width at half maximum (FWHM).

Herein, the FWHM is a width of a wavelength corresponding to a half of a peak absorption point and as the FWHM is narrower, light in a narrower wavelength region may be emitted and higher color purity may be obtained.

The quantum dot may have for example a FWHM of less than or equal to about 50 nm, less than or equal to about 49 nm, less than or equal to about 48 nm, less than or equal to about 47 nm, less than or equal to about 46 nm, less than or equal to about 45 nm, less than or equal to about 44 nm, less than or equal to about 43 nm, less than or equal to about 42 nm, less than or equal to about 41 nm, less than or equal to about 40 nm, less than or equal to about 39 nm, less than or equal to about 38 nm, less than or equal to about 37 nm, less than or equal to about 36 nm, less than or equal to about 35 nm, less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

For example, the quantum dot may include a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof.

The Group II-VI semiconductor compound may be for example a binary element compound such as CdSe, CdTe, ZnS, ZnSe, ZnTe, ZnO, HgS, HgSe, HgTe, MgSe, MgS, or a mixture thereof; a ternary element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a mixture thereof; or a quaternary element compound such as HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof, but is not limited thereto.

The Group III-V semiconductor compound may be for example a binary element compound such as GaN, GaP, GaAs, GaSb, AlN, AlP, AlAs, AlSb, InN, InP, InAs, InSb, or a mixture thereof; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, or a mixture thereof; or GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof, but is not limited thereto.

The Group IV-VI semiconductor compound may be for example a binary element compound such as SnS, SnSe, SnTe, PbS, PbSe, PbTe, or a mixture thereof; a ternary element compound such as SnSeS, SnSeTe, SnSTe, PbSeS, PbSeTe, PbSTe, SnPbS, SnPbSe, SnPbTe, or a mixture thereof; or a quaternary element compound such as SnPbSSe, SnPbSeTe, SnPbSTe, or a mixture thereof, but is not limited thereto.

The Group IV semiconductor compound may be for example a single element semiconductor such as Si, Ge, or a mixture thereof; or a binary element semiconductor compound such as SiC, SiGe, or a mixture thereof, but is not limited thereto.

The Group I-III-VI semiconductor compound may be for example $CuInSe_2$, $CuInS_2$, CuInGaSe, CuInGaS, or a mixture thereof, but is not limited thereto.

The Group I-II-IV-VI semiconductor compound may be for example CuZnSnSe or CuZnSnS, but is not limited thereto.

The Group II-III-V semiconductor compound may include for example InZnP, but is not limited thereto.

The quantum dot may include the binary semiconductor compound, the ternary semiconductor compound, or the quaternary semiconductor compound in a substantially uniform concentration or partially different concentration distributions, for example as a continuous or step gradient.

For example, the quantum dot may include a cadmium-free quantum dot.

Cadmium (Cd) may cause severe environment/health problems and is a restricted element as defined by Restriction of Hazardous Substances Directive (RoHS) in a plurality of countries, and thus the cadmium-free quantum dot may be effectively used.

For example, the quantum dot may be for example a semiconductor compound including zinc (Zn), tellurium (Te), and selenium (Se).

For example, in the semiconductor compound, a content of tellurium (Te) may be smaller than that of selenium (Se).

The quantum dot may have a core-shell structure wherein one quantum dot surrounds, e.g., entirely covers, another quantum dot.

For example, the core and the shell of the quantum dot may have an interface, and an element of at least one of the core or the shell in the interface may have a concentration gradient wherein the concentration of the element(s) of the shell decreases toward the core.

For example, a material composition of the shell of the quantum dot has a wider energy bandgap than a material composition of the core of the quantum dot, and thereby the quantum dot may exhibit a quantum confinement effect.

The quantum dot may have one quantum dot core and a multi-layered quantum dot shell surrounding the core.

Herein, the multi-layered shell has at least two shells wherein each shell may be a single composition, an alloy, and/or the one having a concentration gradient For example, a shell of a multi-layered shell that is relatively farther from the core may have a wider energy bandgap than a shell that is relatively closer to the core, and thereby the quantum dot may exhibit a quantum confinement effect.

For example, the quantum dot having a core-shell structure may for example include a core including a first semiconductor compound including zinc (Zn), tellurium (Te), and selenium (Se) and a shell including a second semiconductor compound disposed on at least a part of the core and having a different composition from that of the core.

The first semiconductor compound may be for example a Zn—Se semiconductor compound including a small amount of tellurium (Te) and, for example, a semiconductor compound represented by $ZnTe_xSe_{1-x}$ (wherein, x is greater than about 0 and less than or equal to about 0.05).

For example, in the first semiconductor compound, the mole amount of zinc (Zn) may be larger than that of selenium (Se), and the mole amount of selenium (Se) may be larger than that of tellurium (Te).

For example, in the first semiconductor compound, a mole ratio of tellurium (Te) to selenium (Se) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1.

For example, in the first semiconductor compound, a mole ratio of tellurium (Te) to zinc (Zn) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01.

The second semiconductor compound may include for example a Group II-VI semiconductor compound, a Group III-V semiconductor compound, a Group IV-VI semiconductor compound, a Group IV semiconductor compound, a Group I-III-VI semiconductor compound, a Group I-II-IV-VI semiconductor compound, a Group II-III-V semiconductor compound, or a combination thereof.

Examples of the Group II-VI semiconductor compound, the Group III-V semiconductor compound, the Group IV-VI semiconductor compound, the Group IV semiconductor compound, the Group I-III-VI semiconductor compound, the Group I-II-IV-VI semiconductor compound, and the Group II-III-V semiconductor compound are the same as described above.

For example, the second semiconductor compound may include zinc (Zn), selenium (Se), and/or sulfur (S).

For example, the shell may include at least one internal shell disposed nearer to the core and an outermost shell further from the core and disposed at the outermost shell of the quantum dot and the internal shell may include ZnSeS and the outermost shell may include ZnS.

For example, the shell may have a concentration gradient of one component and for example an amount of sulfur (S) may increase as a distance away from the core increases.

The quantum dot layer 14 may have for example a thickness of about 5 nm to 200 nm, about 10 nm to about 100 nm, about 10 nm to about 80 nm, about 10 nm to about 50 nm, or about 25 nm to about 40 nm.

The quantum dot layer 14 may have for example a relatively high HOMO energy level ($HOMO_{QD}$) of greater than or equal to about 5.6 eV, greater than or equal to about 5.8 eV, greater than or equal to about 5.9 eV, greater than or equal to about 6.0 eV.

The HOMO energy level ($HOMO_{QD}$) of the quantum dot layer 14 may be for example about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, about 6.0 eV to about 7.0 eV, about 6.0 eV to about 6.8 eV, about 6.0 eV to about 6.7 eV, about 6.0 eV to about 6.5 eV, about 6.0 eV to about 6.3 eV, or about 6.0 eV to about 6.2 eV.

The hole injection layer 12 and the hole transport layer 13 may be in contact with each other, wherein the hole injection layer 12 may be disposed at the side of the anode 11, the hole transport layer 13 may be disposed at the side of the quantum dot layer 14, and thus holes supplied from the anode 11 may be transported to the quantum dot layer 14 through the hole injection layer 12 and the hole transport layer 13.

For example, the hole injection layer 12 may contact the anode 11 and the hole transport layer 13 may contact the quantum dot layer 14.

The hole transport layer 13 may have a relatively high HOMO energy level ($HOMO_{HTL}$) so that it may match HOMO energy level ($HOMO_{QD}$) of the quantum dot layer 14.

Accordingly, mobility of holes transported from the hole transport layer 13 to the quantum dot layer 14 may be increased.

The HOMO energy level ($HOMO_{HTL}$) of the hole transport layer 13 may be the same as or smaller than the HOMO energy level ($HOMO_{QD}$) of the quantum dot layer 14 within a range of less than or equal to about 0.5 eV.

For example, a difference between HOMO energy levels of the hole transport layer 13 and the quantum dot layer 14 may be for example about 0 eV to about 0.5 eV, about 0.01 eV to about 0.4 eV, about 0.01 eV to about 0.3 eV, about 0.01 eV to about 0.2 eV, or about 0.01 eV to about 0.1 eV.

A HOMO energy level ($HOMO_{HTL}$) of the hole transport layer 13 may be for example greater than or equal to about 5.4 eV, greater than or equal to about 5.6 eV, or greater than or equal to about 5.8 eV.

For example, the HOMO energy level ($HOMO_{HTL}$) of hole transport layer 13 may be about 5.4 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

The hole transport layer 13 may be particularly not limited as long as a material satisfies the energy level, e.g., has desirable energy level characteristics, and may include for example poly(9,9-dioctyl-fluorene-co-N-(4-butylphenyl)-diphenylamine) (TFB), a polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), p-type metal oxide (e.g., NiO, WO$_3$, or MoO$_3$), a carbonaceous material such as graphene oxide, or a combination thereof, but is not limited thereto.

The hole injection layer 12 may be disposed between the anode 11 and the hole transport layer 13 and may have a first surface 12a contacting the anode 11 and a second surface 12b contacting the hole transport layer 13.

An average HOMO energy level ($HOMO_{HIL}$) of the hole injection layer 12 may be between a work function ($WF_A$) of the anode 11 and the HOMO energy level ($HOMO_{HTL}$) of the hole transport layer (HTL) 13.

A HOMO energy level of a first surface 12a of the hole injection layer 12 may be different from that of a second surface 12b of the hole injection layer 12.

For example, the HOMO energy level ($HOMO_{HIL}$) of the hole injection layer 12 may be changed along a thickness direction from the first surface 12a to the second surface 12b, for example, HOMO energy levels of the first and second surfaces 12a and 12b of the hole injection layer 12 and between the first and second surfaces 12a and 12b thereof may be different.

For example, the HOMO energy level ($HOMO_{HIL1}$) on the first surface 12a of the hole injection layer 12 may be greater than or equal to the work function ($WF_A$) of the anode 11, for example, within a range of about 5.0 to about 5.5 eV.

For example, a HOMO energy level ($HOMO_{HIL2}$) of the second surface 12b of the hole injection layer 12 may be higher than a HOMO energy level ($HOMO_{HIL1}$) of the first surface 12a of hole injection layer 12, for example, a difference between HOMO energy levels of the second surface 12b of the hole injection layer 12 and the hole transport layer (HTL) 13 may be less than or equal to about 0.5 eV.

A HOMO energy level ($HOMO_{HIL2}$) of the second surface 12b of the hole injection layer 12 may be for example greater than about 5.5 eV and less than or equal to about 7.0 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.6 eV to about 6.0 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, about 5.8 eV to about 6.1 eV, or about 5.8 eV to about 6.0 eV.

A HOMO energy level ($HOMO_{HIL}$) between the first and second surfaces 12a and 12b of the hole injection layer 12 may change gradually from the first surface 12a of the hole injection layer 12 to the second surface 12b of the hole injection layer 12, for example, the HOMO energy level ($HOMO_{HIL}$) of the hole injection layer 12 may be increased gradually from the first surface 12a of the hole injection layer 12 to the second surface 12b of the hole injection layer 12.

Accordingly, the hole injection layer 12 may decrease an energy barrier due to the difference of the HOMO energy level between the anode 11 and hole injection layer 12 and between the hole injection layer 12 and the hole transport layer 13 and thus prevent deterioration of hole mobility and accordingly, smoothly transport holes from the anode 11 to the hole transport layer 13.

An average HOMO energy level of the hole injection layer 12 may be in a range from about 5.6 eV to about 6.2 eV.

A hole injection layer 12 having a gradually changing, e.g., gradient, HOMO energy level may be realized in various methods.

For example, the hole injection layer 12 may include at least two materials having a different HOMO energy level, for example, a first compound and a second compound having a greater HOMO energy level than that of the first compound.

The first compound and the second compound are independently a monomer, an oligomer, a polymer, and/or an ion compound, which is included alone respectively or as a mixture of at least two.

For example, the hole injection layer 12 may include at least two materials having different HOMO energy levels and surface energies, for example, a first compound and a second compound having greater HOMO energy level than the first compound and a surface energy less than a surface energy of the first compound.

The first compound and the second compound are independently a monomer, an oligomer, a polymer, and/or an ion compound, which may be used as a mixture of at least two as well as a single compound alone.

Accordingly, the first and second compounds may be self-assembled in a different weight ratio along a thickness direction within the hole injection layer 12 due to a surface energy difference, for example, a weight ratio of the first and second compounds in the second surface 12b of the hole injection layer 12 may be larger than that of the first and second compounds in first surface 12a of the hole injection layer 12, and the weight ratio of the second compound to the first compound from the first surface 12a of the hole injection layer 12 to the second surface 12b of the hole injection layer 12 may be gradually increased.

Accordingly, a gradually changing, e.g., gradient, HOMO energy level along a thickness direction of the hole injection layer 12 may be realized.

For example, the hole injection layer 12 may include at least two materials having different HOMO energy levels, surface energies, and electric characteristics, for example, a first compound having a first conductivity and a second compound having a greater HOMO energy level than the first compound and a surface energy less than a surface energy of the first compound. The second compound may include an insulating compound The first compound and the second compound are independently a monomer, an oligomer, a polymer, and/or an ion compound, which may be used alone respectively or as a mixture of at least two.

Accordingly, the first and second compounds may not only be self-assembled due to a surface energy difference of the first and second compounds within the hole injection layer 12 and thus realize a gradually changing, e.g., gradient, HOMO energy level along a thickness direction of the hole injection layer 12 but may also block transport of electrons from the hole transport layer (HTL) 13 to the hole injection layer 12 and thus decrease a leakage current without a separate electron blocking layer, since the second compound having insulation is mainly distributed on the second surface 12a of the hole injection layer 12.

For example, the first compound may include a conductive compound and the second compound may include an insulating compound.

The conductive compound may be for example a conductive polymer, and the insulating compound may be for example an insulating polymer.

The conductive polymer may be a polymer having the described HOMO energy level characteristics, and the insulating polymer may be a polymer having a greater HOMO energy level than the conductive polymer and a surface energy less than a surface energy of the conductive polymer.

Accordingly, since the first and second compounds are self-assembled due to a surface energy difference of the first and second compounds in the hole injection layer 12, and thus the insulating polymer is mainly distributed on the second surface 12b of the hole injection layer 12, a gradually changing, e.g., gradient, HOMO energy level along a thickness direction from the first surface 12a of the hole injection layer 12 to the second surface 12b thereof may be realized.

In addition, the first surface 12a of the hole injection layer 12 may increase a hole injection property of the hole injection layer 12 due to highly conductive characteristics of the conductive polymer, and the second surface 12b of the hole injection layer 12 may simultaneously decrease a leakage current on the interface with the hole transport layer (HTL) 13 due to insulating characteristics of the insulating polymer.

The conductive polymer may be any suitable conductive polymer satisfying a HOMO energy level ($HOMO_{HIL1}$) of the first surface 12a without a particular limit, for example, conductivity of greater than or equal to about $1 \times 10^{-7}$ siemens/centimeter (S/cm), for example, greater than or equal to about $1 \times 10^{-7}$ S/cm to 1000 S/cm.

The conductive polymer may include for example polythiophene, polyaniline, polypyrrole, poly(para-phenylene), polyfluorene, poly(3,4-ethylenedioxythiophene), a derivative thereof, or a combination thereof, but is not limited thereto.

For example, the conductive polymer may be a charged polymer, for example, a positively-charged polymer or a negatively-charged polymer.

For example, the conductive polymer may include a copolymer having a structural unit represented by Chemical Formula 2 and a structural unit represented by Chemical Formula 3, but is not limited thereto.

Chemical Formula 2

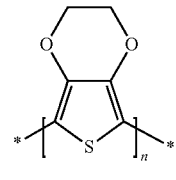

Chemical Formula 3

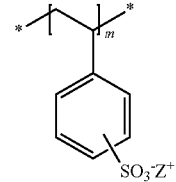

In Chemical Formula 2 or 3, $Z^+$ is a cation, and n and m denote a mole number of each structural unit of Chemical Formula 2 or Chemical Formula 3, wherein $0.0001 \leq n/m \leq 1$. Such copolymers are known as poly(3,4-ethylenedioxythiophene)-poly(styrenesulfonate) (PEDOT: PSS) polymers.

For example, the conductive polymer may a include polyaniline:dodecylbenzenesulfonic acid system, a polyaniline:camphorsulfonic acid system, and/or a polyaniline:poly (4-styrene sulfonate) system, but is not limited thereto.

The insulating polymer may be any suitable insulating polymer having higher HOMO energy level than the conductive polymer and a surface energy less than a surface energy of the conductive polymer without a particular limit, for example, a fluorine-containing polymer, for example, a fluorine-containing polymer having ion characteristics.

For example, the insulating polymer may include a structural unit represented by Chemical Formula 4 or a structural unit represented by Chemical Formula 5, but is not limited thereto.

Chemical Formula 4

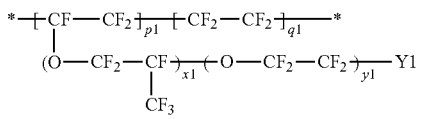

Chemical Formula 5

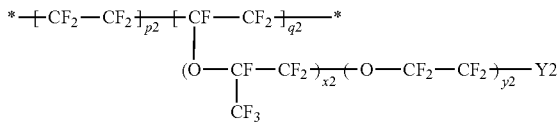

In Chemical Formula 4 or 5,

Y1 and Y2 are independently $-COC^-M^+$, $-SO_3M^+$, or $-PO_3{}^{2-}(M^+)_2$, wherein $M^+$ is $Na^+$, $K^+$, $Li^+$, $H^+$, or $NH^{4+}$, p1, q1, p2, and q2 independently satisfy $0<p1\leq10,000,000$, $0<q1\leq10,000,000$, $0<p2\leq10,000,000$, and $0<q2\leq10,000,000$, and x1, y1, x2, and y2 are independently an integer ranging from 0 to 20.

The insulating polymer may be for example present in a form of a hydrate.

For example, the second compound may be included in a greater amount than the first compound.

For example, a weight ratio of the first compound to the second compound may be about 1:1.1 to about 1:10, about 1:1.1 to about 1:8, about 1:1.1 to about 1:6, about 1:1.1 to about 1:4, about 1:1.5 to about 1:4, or about 1:1.8 to about 1:3.6.

For example, when the first compound is a conductive polymer and the second compound is an insulating polymer, a weight ratio of the conductive polymer to the insulating polymer may be about 1:1.1 to about 1:10, about 1:1.1 to about 1:8, about 1:1.1 to about 1:6, about 1:1.1 to about 1:4, about 1:1.5 to about 1:4, or about 1:1.8 to about 1:3.6.

When the first and second compounds are included within the disclosed ranges, the hole injection layer 12 may have the above HOMO energy level and thus may be effectively matched between the anode 11 and the hole transport layer 13 having a high HOMO energy level, to effectively increase hole mobility.

The first compound and the second compound may be dissolved or dispersed in a solvent and may be applied in a form of a solution, and the solvent may be for example a polar solvent, for example deionized water, methanol, ethanol, propanol, isopropanol, 2-methoxyethanol, 2-ethoxyethanol, 2-propoxyethanol, 2-butoxyethanol, methylcellosolve, ethyl cellosolve, diethylene glycol methyl ether, diethylene glycol ethyl ether, dipropylene glycol methyl ether, toluene, xylene, hexane, heptane, octane, ethyl acetate, butyl acetate, diethylene glycol dimethyl ether, diethylene glycol dimethyl ethyl ether, methyl ethoxy propionate, ethyl ethoxy propionate, ethyl lactate, propylene glycol methyl ether acetate, propylene glycol methyl ether, propylene glycol propyl ether, methyl cellosolve acetate, ethyl cellosolve acetate, diethylene glycol methyl acetate, diethylene glycol ethyl acetate, acetone, methyl isobutyl ketone, cyclohexanone, dimethyl formamide (DMF), dimethylsulfoxide, N,N-dimethyl acetamide (DMAc), N-methyl-2-pyrrolidone, γ-butyrolactone, diethylether, ethylene glycol dimethyl ether, diglyme, tetrahydrofuran, acetylacetone, chlorobenzene, acetonitrile, or a combination thereof.

The electron auxiliary layer 15 may be disposed between the cathode 16 and the quantum dot layer 13 and may include one layer or two or more layers.

The electron auxiliary layer 15 may be omitted as needed.

The electron auxiliary layer 15 may be an electron transport layer, an electron injection layer, a hole blocking layer, or a combination thereof.

The electron transport layer may include for example 1,4,5,8-naphthalene-tetracarboxylic dianhydride (NTCDA), bathocuproine (BCP), tris[3-(3-pyridyl)-mesityl]borane (3TPYMB), LiF, Alq$_3$, Gaq$_3$, Inq$_3$, Znq$_2$, Zn(BTZ)$_2$, BeBq$_2$, ET204 (8-(4-(4,6-di(naphthalen-2-yl)-1,3,5-triazin-2-yl) phenyl)quinolone), 8-hydroxyquinolinato lithium (Liq), an n-type metal oxide (e.g., ZnO, HfO$_2$ etc.), or a combination thereof, but is not limited thereto. In the foregoing "q" is 8-hydroxyquinoline, "BTZ" is 2-(2-hydroxyphenyl)benzothiazolate, and "Bq" is 10-hydroxybenzo[h]quinoline.

The hole blocking layer may include for example 1,4,5, 8-naphthalene-tetracarboxylic dianhydride (NTCDA), bathocuproine (BCP), tris[3-(3-pyridyl)-mesityl]borane (3TPYMB), LiF, Alq3, Gaq3, Inq$_3$, Znq$_2$, Zn(BTZ)$_2$, BeBq$_2$, or a combination thereof, but is not limited thereto.

The hole injection layer, the hole transport layer, the quantum dot layer, and the electron auxiliary layer may be for example formed by a solution process, for example spin coating, slit coating, inkjet printing, nozzle printing, spraying, and/or doctor blade coating, but is not limited thereto.

The quantum dot device may be for example applied to various electronic devices such as display devices or lighting devices, and the like.

Hereinafter, the embodiments are illustrated in more detail with reference to examples. However, these examples are exemplary, and the present disclosure is not limited thereto.

SYNTHESIS OF QUANTUM DOT

Synthesis Example 1

Synthesis of ZnTeSe Core

Selenium (Se) and tellurium (Te) are respectively dispersed in trioctylphosphine (TOP) to prepare a 2 molar (M) Se/TOP stock solution and a 0.1 M Te/TOP stock solution. 0.125 millimoles (mmol) of zinc acetate along with 0.25 mmol of palmitic acid, 0.25 mmol of hexadecyl amine, and 10 milliliters (mL) of trioctylamine is put in a reactor, and the reactor is heated at 120° C. under vacuum. One hour later, an atmosphere in the reactor is converted into nitrogen. After heating the reactor at 300° C., the Se/TOP stock solution and the Te/TOP stock solution in a Te/Se ratio of 1/25 is rapidly injected thereinto. Subsequently, acetone is added to the reaction solution rapidly cooled down to room temperature after 10 minutes, 30 minutes, or 60 minutes, and a precipitate centrifuged therefrom is dispersed in toluene to obtain a ZnTeSe quantum dot.

Synthesis Example 2

Synthesis of Quantum Dot of ZnTeSe Core/ZnSeS Shell 1.8 mmol (0.336 grams (g)) of zinc acetate, 3.6 mmol (1.134 g) of oleic acid, and 10 mL of trioctylamine are put in a flask and then, vacuum-treated at 120° C. for 10 minutes. Nitrogen ($N_2$) is used to substitute an internal atmosphere of the flask, and the flask is heated up to 180° C. The ZnTeSe core according to Synthesis Example 1 is added thereto within 10 seconds, subsequently, 0.04 mmol of Se/TOP is slowly injected thereinto, and the mixture is heated up to 280° C. Then, 0.01 mmol of S/TOP is added thereto, and the obtained mixture is heated up to 320° C. and reacted for 10 minutes. Subsequently, a mixed solution of 0.02 mmol of Se/TOP and 0.04 mmol of S/TOP is slowly injected thereinto, and the obtained mixture is reacted for 20 minutes again. Then, when a step of injecting a mixed solution by changing a mixing ratio of Se and S and reacting the obtained mixture for 20 minutes is repeated, the mixed solution of Se and S is a mixed solution of 0.01 mmol of Se/TOP and 0.05 mmol of S/TOP, a mixed solution of 0.005 mmol of Se/TOP and 0.1 mmol of S/TOP, and 0.5 mmol of a S/TOP solution, which are sequentially used. When the reaction is all complete, the reactor is cooled down, and nanocrystal produced therein is centrifuged with ethanol and dispersed in toluene to obtain a ZnTeSe/ZnSeS core-shell quantum dot.

Preparation of Solution for Hole Injection Layer

Preparation Example 1

A solution for a hole injection layer is prepared by mixing a conductive polymer solution ((poly(3,4-ethylenedioxythiophene)polystyrene sulfonate, PEDOT:PSS) (HOMO: 5.3 eV) (Clevios™ A14083, Heraeus Company, 6 parts by weight of PSS based on 1 part by weight of PEDOT) and an insulating polymer solution including a polymer represented by Chemical Formula A (water:alcohol=4.5:5.5 ratio by volume (v/v), 5 weight percent (wt %), Aldrich-Sigma Co., Ltd.) in a weight ratio of 1:1 (a weight ratio of a polymer solute:1:3.6 ratio by weight (w/w)).

Chemical Formula A

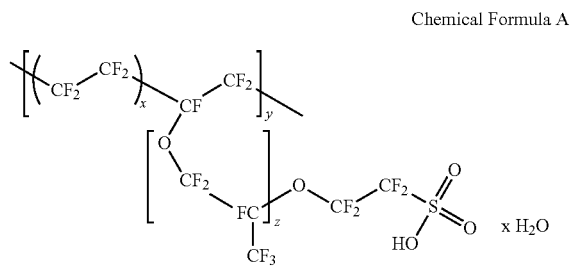

Preparation Example 2

A solution for a hole injection layer is prepared according to the same method as Preparation Example 1 except for mixing a conductive polymer solution and an insulating polymer solution in a weight ratio of 4:1 (a weight ratio of a polymer solute:1:0.9 w/w).

Preparation Example 3

A solution for a hole injection layer is prepared according to the same method as Preparation Example 1 except for mixing a conductive polymer solution and an insulating polymer solution in a weight ratio of 16:1 (a weight ratio of a polymer solute:1:0.23 w/w).

Preparation Example 4

A solution for a hole injection layer is prepared according to the same method as Preparation Example 1 except for including a conductive polymer solution without an insulating polymer solution.

Evaluation I

Each 35 nm-thick hole injection layer is formed by respectively coating the solutions for a hole injection layer according to Preparation Examples 1 to 4 on a silicon wafer and heat-treating it at 150° C. for 30 minutes.

A HOMO energy level on the surface of the hole injection layer is measured by using an AC-3 surface analyzer.

The results are shown in Table 1.

TABLE 1

|  | HOMO energy level (eV) |
| --- | --- |
| Preparation Example 1 | 6.04 |
| Preparation Example 2 | 5.78 |
| Preparation Example 3 | 5.52 |
| Preparation Example 4 | 5.28 |

Referring to Table 1, the HOMO energy level is adjusted according to a mixing ratio of a conductive polymer and an insulating polymer.

Evaluation II

Each 35 nm-thick hole injection layer is formed by coating the solution according to Preparation Example 1 on a silicon wafer and heat-treating it at 150° C. for 30 minutes.

A composition depending on a thickness of the hole injection layer and a HOMO energy level is examined.

The composition depending on the thickness of the hole injection layer is examined by using VersaProbe (ULVAC-PHI, Inc).

Figure 3:
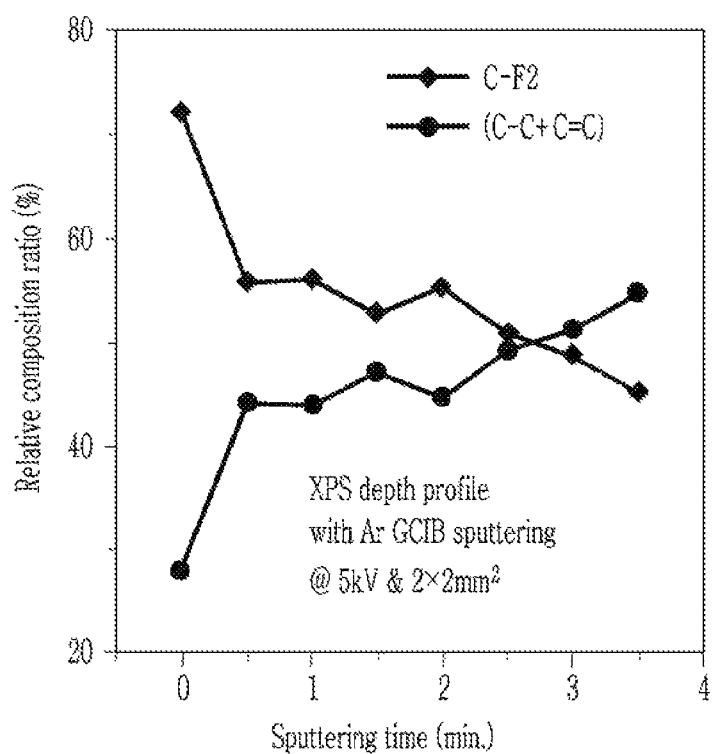
FIG. 3 is a graph showing weight ratios in a thickness direction of the hole injection layer according to Preparation Example 1.

In FIG. 3 and Table 2, a first surface of the hole injection layer contacts the silicon wafer, and a second surface of the hole injection layer faces the first surface of the hole injection layer.

FIG. 3 is a graph showing a weight ratio depending on a thickness of the hole injection layer according to Preparation Example 1.

TABLE 2

|  | HOMO energy level (eV) |
| --- | --- |
| First surface of hole injection layer | 5.28 |
| Second surface of hole injection layer | 6.04 |

Referring to Table 2, the first and second surfaces of the hole injection layer have a different HOMO energy level.

Referring to FIG. 3, on the second surface of the hole injection layer, a fluorine-containing group ($CF_2$) derived from an insulating polymer is most distributed, and a weight ratio of a group derived from a conductive polymer and a group derived from an insulating polymer is changed along a thickness direction.

Referring to Table 2 and FIG. 3, the HOMO energy level is changed depending on the weight ratio of the conductive polymer and the insulating polymer.

Manufacture of Quantum Dot Device I (ZnTeSe)

Example 1

A 35 nm-thick hole injection layer is formed by spin-coating the solution for a hole injection layer according to Preparation Example 1 and heat-treating it at 150° C. for 30 minutes on a glass substrate deposited with ITO (WF: 4.8 eV) after the glass substrate is surface-treated with an ultraviolet (UV)-ozone. Subsequently, on the hole injection layer, a 25 nm-thick hole transport layer (HTL) (HOMO: 5.6 eV) is formed by spin-coating a poly[(9,9-dioctylfluorenyl-2,7-diyl-co(4,4'-(N-4-butylphenyl)diphenylamine] solution (TFB) (Lumtec) and heat-treating it at 150° C. for 30 minutes. Subsequently, on the hole transport layer (HTL), a dot layer (HOMO: 6.0 eV) is formed by spin-coating the ZnTeSe quantum dot (a peak emission wavelength: 453 nm) according to Synthesis Example 2 and heat-treating it at 150° C. for 30 minutes. On the quantum dot layer, a 36 nm-thick electron transport layer (ETL) is formed by vacuum-depositing NET218:NDN87 (NOVALED), and a cathode is formed by vacuum-depositing Liq to be 5 nm thick and aluminum (Al) to be 90 nm thick to manufacture a quantum dot device.

Example 2

A 35 nm-thick hole injection layer is formed by spin-coating the solution for a hole injection layer according to Preparation Example 1 on a glass substrate deposited with ITO (WF: 4.8 eV) after the glass substrate is surface-treated with an UV-ozone for 15 minutes and then, heat-treating the coated solution at 150° C. for 30 minutes. Subsequently, on the hole injection layer, a 25 nm-thick hole transport layer (HTL) (HOMO: 6.0 eV) is formed by spin-coating poly(9-vinylcarbazole) (PVK) (LUMTEC) and heat-treating it at 150° C. for 30 minutes. On the hole transport layer (HTL), a quantum dot layer (HOMO: 6.0 eV) is formed by spin-coating the ZnTeSe quantum dot (a peak emission wavelength: 453 nm) according to Synthesis Example 2 and heat-treating it at 150° C. for 30 minutes. Subsequently, on the quantum dot layer, a 36 nm-thick electron transport layer (ETL) is formed by vacuum-depositing NET430:NDN77 (NOVALED), and a cathode is formed by vacuum-depositing aluminum (Al) to be 90 nm thick to manufacture a quantum dot device.

Comparative Example 1

A quantum dot device is manufactured according to the same method as Example 1 except for using the solution for a hole injection layer according to Preparation Example 4 instead of the solution for a hole injection layer according to Preparation Example 1.

Comparative Example 2

A quantum dot device is manufactured according to the same method as Example 2 except for using the solution for a hole injection layer according to Preparation Example 4 instead of the solution for a hole injection layer according to Preparation Example 1.

Evaluation III

Current-voltage-luminescence characteristics of the quantum dot devices according to Examples 1 and 2 and Comparative Examples 1 and 2 are evaluated.

The current-voltage-luminescence characteristics are evaluated by using a Keithley 220 current source and Minolta CS200 spectroradiometer.

The results are shown in Tables 3 and 4.

TABLE 3

|  | Example 1 | Comparative Example 1 |
|---|---|---|
| $EQE_{max}$ | 3.372 | 2.709 |
| EQE @ 100 candela per square meter (nit) | 2.709 | 2.318 |
| $Cd/A_{max}$ | 2.492 | 2.166 |
| $Cd/m^2$ @ 5 milliamperes (mA) | 94.857 | 88.927 |
| $\lambda_{max}$ | 453 | 453 |
| Full width at half maximum (FWHM) (nm) | 26 | 28 |
| CIE x | 0.1494 | 0.1494 |
| CIE y | 0.0702 | 0.0782 |
| Life-span (T50, h) | 0.26 | 0.16 |

TABLE 4

|  | Example 2 | Comparative Example 2 |
|---|---|---|
| $EQE_{max}$ | 8.376 | 6.608 |
| EQE @ 100 nit | 7.328 | 5.978 |
| EQE @ 500 nit | 4.388 | 2.327 |
| EQE @ 1000 nit | 2.375 | 1.045 |
| $Cd/A_{max}$ | 5.126 | 4.565 |
| $Cd/m^2$ @ 5 mA | 180.844 | 174.496 |
| $\lambda_{max}$ | 453 | 452 |
| Full width at half maximum (FWHM) (nm) | 23 | 29 |
| CIE x | 0.1465 | 0.1457 |
| CIE y | 0.0516 | 0.0692 |
| life-span (T50, h) | 0.34 | 0.22 |

$EQE_{max}$: maximum external quantum efficiency

EQE@100 nit, 500 nit, 1000 nit: external quantum efficiency at 100 nit, 500 nit, 1000 nit $Cd/A_{max}$: maximum current efficiency $Cd/m^2$@5 mA: luminance at 5 mA Referring to Tables 3 and 4, the quantum dot devices according to Examples 1 and 2 exhibit an improved efficiency and life-span compared with the quantum dot devices according to Comparative Examples 1 and 2.

Manufacture of Quantum Dot Device II

Example 3

A 35 nm-thick hole injection layer is formed by spin-coating the solution for a hole injection layer according to Preparation Example 1 on a glass substrate deposited with ITO (WF: 4.8 eV) after the glass substrate is surface-treated with an UV-ozone for 15 minutes and then, heat-treating the coated solution at 150° C. for 30 minutes. Subsequently, on the hole injection layer, a 25 nm-thick hole transport layer (HTL) (HOMO: 5.6 eV) is formed by spin-coating a poly [(9,9-dioctylfluorenyl-2,7-diyl-co(4,4'-(N-4-butylphenyl)diphenylamine] solution (TFB) (Lumtec) and heat-treating it at 150° C. for 30 minutes. On the hole transport layer (HTL), a CdSe quantum dot layer (HOMO: 6.0 eV) is formed by spin-coating a quantum dot having a peak emission wavelength of 621 nm and heat-treating it at 150° C. for 30 minutes. Subsequently, on the quantum dot layer, a 20 nm-thick electron transport layer (ETL) is formed by spin-coating ZnO, and a cathode is formed by vacuum-depositing aluminum (Al) to be 90 nm thick to manufacture a quantum dot device.

Example 4

A quantum dot device is manufactured according to the same method as Example 3 except for forming the hole injection layer (HOMO: 6.0 eV) by using poly(9-vinylcarbazole) (PVK) (Lumtec) instead of the poly[(9,9-dioctylfluorenyl-2,7-diyl-co(4,4'-(N-4-butylphenyl)diphenylamine] solution (TFB).

Comparative Example 3

A quantum dot device is manufactured according to the same method as Example 3 except for using the solution for a hole injection layer according to Preparation Example 4 instead of the solution for a hole injection layer according to Preparation Example 1.

Comparative Example 4

A quantum dot device is manufactured according to the same method as Example 4 except for using the solution for a hole injection layer according to Preparation Example 4 instead of the solution for a hole injection layer according to Preparation Example 1.

Evaluation IV

External quantum efficiency, leakage current, and life-span characteristics of the quantum dot devices according to Examples 3 and 4 and Comparative Examples 3 and 4 are compared.

The results are shown in Tables 5 and 6.

TABLE 5

|  | Example 3 | Comparative Example 3 |
| --- | --- | --- |
| $EQE_{max}$ | 8.729 | 6.7282 |
| EQE @ 100 nit | 7.000 | 3.672 |
| EQE @ 500 nit | 8.541 | 5.142 |
| EQE @ 1000 nit | 8.691 | 5.626 |
| $Cd/A_{max}$ | 13.892 | 10.727 |
| $Cd/m^2$ @ 5 mA | 691.555 | 405.090 |
| $\lambda_{max}$ | 621 | 621 |
| Full width at half maximum (FWHM) (nm) | 33 | 32 |
| CIE x | 0.6716 | 0.6697 |
| CIE y | 0.3281 | 0.3290 |
| life-span (T50, h) | 3.2 | 2.5 |

TABLE 6

|  | Example 4 | Comparative Example 4 |
| --- | --- | --- |
| $EQE_{max}$ | 9.159 | 7.0092 |
| EQE @ 100 nit | 7.190 | 1.476 |
| EQE @ 500 nit | 8.965 | 3.516 |
| EQE @ 1000 nit | 9.157 | 4.625 |
| $Cd/A_{max}$ | 14.350 | 11.104 |
| $Cd/m^2$ @ 5 mA | 712.648 | 168.182 |
| $\lambda_{max}$ | 621 | 621 |
| Full width at half maximum (FWHM) (nm) | 34 | 34 |
| CIE x | 0.6715 | 0.6693 |
| CIE y | 0.3283 | 0.3301 |
| Life-span (T50, h) | 2.3 | 1.8 |

Referring to Tables 5 and 6, the quantum dot devices according to Examples 3 and 4 show an improved efficiency and life-span compared with the quantum dot devices according to Comparative Examples 3 and 4.

Manufacture of Quantum Dot Device III

Example 5

A 35 nm-thick hole injection layer is formed by spin-coating the solution for a hole injection layer according to Preparation Example 1 on a glass substrate deposited with ITO (WF: 4.8 eV) after the glass substrate is surface-treated with an UV-ozone for 15 minutes and then, heat-treating it at 150° C. for 30 minutes. Subsequently, on the hole injection layer, a 25 nm-thick hole transport layer (HTL) (HOMO: 5.6 eV) is formed by spin-coating a poly[(9,9-dioctylfluorenyl-2,7-diyl-co(4,4'-(N-4-butylphenyl)diphenylamine] solution (TFB) (Lumtec) and heat-treating it at 150° C. for 30 minutes. On the hole transport layer (HTL), a quantum dot layer (HOMO: 5.6 eV) is formed by spin-coating an InP quantum dot having a peak emission wavelength of 633 nm and heat-treating it at 150° C. for 30 minutes. On the quantum dot layer, a 36 nm-thick electron transport layer (ETL) is formed by vacuum-depositing NET218:NDN87 (NOVALED), and a cathode is formed thereon by vacuum-depositing Liq to be 5 nm thick and aluminum (Al) to be 90 nm thick to manufacture a quantum dot device.

Comparative Example 5

A quantum dot device is manufactured according to the same method as Example 5 except for using the solution for a hole injection layer according to Preparation Example 4 instead of the solution for a hole injection layer according to Preparation Example 1.

Evaluation V

External quantum efficiency, leakage current, and life-span characteristics of the quantum dot devices according to Example 5 and Comparative Example 5 are compared.

The results are shown in Table 7.

TABLE 7

|  | Example 5 | Comparative Example 5 |
| --- | --- | --- |
| $EQE_{max}$ | 2.40 | 1.36 |
| EQE @ 100 nit | 1.43 | 1.07 |
| EQE @ 500 nit | 1.06 | 0.52 |
| EQE @ 1000 nit | 0.42 | — |
| $Cd/A_{max}$ | 2.73 | 1.59 |
| $Cd/m^2$ @ 5 mA | 80.95 | 61.84 |
| $\lambda_{max}$ | 633 | 633 |
| Full width at half maximum (FWHM) (nm) | 41 | 42 |
| CIE x | 0.67 | 0.66 |
| CIE y | 0.32 | 0.32 |
| life-span (T50, h) | 0.7 | 0.5 |

Referring to Table 7, the quantum dot device according to Example 5 shows an improved efficiency and life-span compared with the quantum dot device according to Comparative Example 5.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot device, comprising an anode,
   a hole injection layer on the anode,
   a hole transport layer on the hole injection layer,
   a quantum dot layer on the hole transport layer, and
   a cathode on the quantum dot layer, wherein the hole injection layer is a single-layer having a first surface contacting the anode and a second surface contacting the hole transport layer,
a highest occupied molecule orbital energy level of the first surface of the hole injection layer is different from a highest occupied molecule orbital energy level of the second surface of the hole injection layer, and
a difference between the highest occupied molecule orbital energy level of the second surface of the hole injection layer and the highest occupied molecule orbital energy level of the hole transport layer is less than about 0.5 electronvolts.

2. The quantum dot device of claim 1, wherein the highest occupied molecule orbital energy level of the second surface of the hole injection layer is greater than the highest occupied molecule orbital energy level of the first surface of the hole injection layer.

3. The quantum dot device of claim 1, wherein the highest occupied molecule orbital energy level of the hole transport layer is greater than or equal to about 5.4 electronvolts.

4. The quantum dot device of claim 1, wherein the highest occupied molecule orbital energy level of the hole transport layer is about 5.6 electronvolts to about 7 electronvolts.

5. The quantum dot device of claim 1, wherein the highest occupied molecule orbital energy level of the quantum dot layer is about 5.6 electronvolts to about 7 electronvolts.

6. The quantum dot device of claim 1, wherein the quantum dot layer comprises a cadmium-free quantum dot.

7. The quantum dot device of claim 1, wherein the quantum dot layer comprises a quantum dot having a core-shell structure.

8. The quantum dot device of claim 7, wherein the quantum dot comprises a core comprising zinc, tellurium, and selenium and a shell on at least one part of the core, the shell having a different composition from that of the core.

9. The quantum dot device of claim 8, wherein the shell comprises ZnSeS, ZnS, or a combination thereof.

10. An electronic device comprising the quantum dot device of claim 1.

11. A quantum dot device, comprising
an anode,
a hole injection layer on the anode,
a hole transport layer on the hole injection layer,
a quantum dot layer on the hole transport layer, and
a cathode on the quantum dot layer,
wherein the hole injection layer is a single-layer having a first surface contacting the anode and a second surface contacting the hole transport layer,
a highest occupied molecule orbital energy level of the first surface of the hole injection layer is different from a highest occupied molecule orbital energy level of the second surface of the hole injection layer,
the highest occupied molecule orbital energy level of the first surface of the hole injection layer is about 5.0 electronvolts to about 5.5 electronvolts, and
the highest occupied molecule orbital energy level of the second surface of the hole injection layer is greater than about 5.5 electronvolts and less than or equal to about 7 electronvolts.

12. A quantum dot device, comprising
an anode,
a hole injection layer on the anode,
a hole transport layer on the hole injection layer,
a quantum dot layer on the hole transport layer, and
a cathode on the quantum dot layer,
wherein the hole injection layer is a single-layer having a first surface contacting the anode and a second surface contacting the hole transport layer,
a highest occupied molecule orbital energy level of the first surface of the hole injection layer is different from a highest occupied molecule orbital energy level of the second surface of the hole injection layer, and
the hole injection layer comprises a first compound and a second compound, the second compound having a higher highest occupied molecule orbital energy level than the first compound and a surface energy less than a surface energy of the first compound.

13. The quantum dot device of claim 12, wherein
the first compound comprises a conductive polymer, and
the second compound comprises an insulating polymer.

14. The quantum dot device of claim 12, wherein a weight ratio of the second compound to the first compound at the second surface of the hole injection layer is greater than a weight ratio of the second compound to the first compound at the first surface of the hole injection layer.

15. The quantum dot device of claim 12, wherein a weight ratio of the second compound to the first compound is gradually increased from the first surface of the hole injection layer to the second surface of the hole injection layer.

16. The quantum dot device of claim 12, wherein the second compound is present in a greater amount than the first compound.

17. The quantum dot device of claim 16, wherein a weight ratio of the first compound to the second compound is about 1:1.1 to about 1:10.

18. The quantum dot device of claim 12, wherein the first compound comprises polythiophene, polyaniline, polypyrrole, poly(para-phenylene), polyfluorene, poly(3,4-ethylenedioxythiophene), a derivative thereof, or a combination thereof.

19. The quantum dot device of claim 12, wherein the second compound comprises a fluorine-containing polymer.

20. A quantum dot device, comprising
an anode and a cathode facing each other,
a quantum dot layer between the anode and the cathode, and
a hole injection layer between the anode and the quantum dot layer,
wherein the hole injection layer has a first surface contacting the anode and a second surface facing the first surface,
the hole injection layer comprises a first compound and a second compound, the second compound having a higher highest occupied molecule orbital energy level than the first compound and a surface energy less than a surface energy of the first compound,
the second compound is present in a greater amount than the first compound, and
a weight ratio of the second compound to the first compound at the first surface of the hole injection layer is different from a weight ratio of the second compound to the first compound at the second surface of the hole injection layer.

21. The quantum dot device of claim 20, wherein
the first compound comprises a conductive polymer, and
the second compound comprises an insulating polymer.

22. The quantum dot device of claim 20, wherein a weight ratio of the second compound to the first compound at the second surface of the hole injection layer is greater than a weight ratio of the second compound to the first compound at the first surface of the hole injection layer.

23. The quantum dot device of claim 20, wherein a weight ratio of the first compound to the second compound is about 1:1.1 to about 1:10.

24. The quantum dot device of claim 20, further comprising a hole transport layer between the hole injection layer and the quantum dot layer,
wherein the highest occupied molecule orbital energy level of the hole transport layer is greater than or equal to about 5.4 electronvolts.

25. The quantum dot device of claim 24, wherein the highest occupied molecule orbital energy level of the hole transport layer is about 5.6 electronvolts to about 7 electronvolts.

* * * * *